United States Patent
Vakhshoori et al.

(10) Patent No.: US 6,639,922 B2
(45) Date of Patent: Oct. 28, 2003

(54) WAVELENGTH LOCKER AND OPTICAL SYSTEM USING THE SAME

(75) Inventors: Daryoosh Vakhshoori, Cambridge, MA (US); Masud Azimi, Nashua, NH (US); Bartley C. Johnson, North Andover, MA (US); Rong Huang, Woburn, MA (US)

(73) Assignee: CoreTek, Inc., Billerica, MA (US)

( * ) Notice: Subject to any disclaimer, the term of this patent is extended or adjusted under 35 U.S.C. 154(b) by 72 days.

(21) Appl. No.: 10/021,921

(22) Filed: Dec. 13, 2001

(65) Prior Publication Data

US 2003/0112837 A1 Jun. 19, 2003

(51) Int. Cl.[7] ................................................ H01S 3/10
(52) U.S. Cl. .......................................... 372/20; 372/32
(58) Field of Search .............................. 372/20, 45, 32

(56) References Cited

U.S. PATENT DOCUMENTS 6,438,149 B1 * 8/2002 Tayebati et al. ............... 372/45
6,549,548 B2 * 4/2003 Kuznetsov et al. ............ 372/32
2002/0048301 A1 * 4/2002 Wang et al. ................... 372/45
2002/0181515 A1 * 12/2002 Vilhemsson et al. .......... 372/20

* cited by examiner

Primary Examiner—Paul Ip
Assistant Examiner—Hung Vy
(74) Attorney, Agent, or Firm—Pandiscio & Pandiscio, P.C.

(57) ABSTRACT

Apparatus for use in tuning a tunable optical device to a target wavelength, the apparatus comprising: a beam splitter for tapping a portion of the light emerging from the tunable optical device; a walk-off reflector for dividing the portion of the light emerging from the beam splitter into a plurality of beams; a multiple etalon for tailoring the light from at least two of the plurality of beams provided by the walk-off reflector; a multiple detector for detecting light from the multiple etalon and the walk-off reflector, the multiple detector providing a plurality of output signals; and a control unit for controlling the tunable optical device by providing a control signal to the tunable optical device according to the output signals provided by the multiple detector.

25 Claims, 11 Drawing Sheets

| I/U CHANNEL NO. | OUTPUT TO USE $(I_1/I_4)$ OR $(I_2/I_4)$ | NO. OF PEAKS TO COUNT FROM REFERENCE PEAK $(I_3/I_4)$ | SLOPE OF ETALON OUTPUT (RISING OR FALLING) | MAGNITUDE OF REGULARIZED OUTPUT $(I_1/I_4)$ OR $(I_2/I_4)$ |
|---|---|---|---|---|
| 21 | $(I_2/I_4)$ | -1 | RISING | $x_{21}$ |
| 22 | $(I_1/I_4)$ | -1 | RISING | $x_{22}$ |
| 23 | $(I_2/I_4)$ | +1 | FALLING | $x_{23}$ |
| 24 | $(I_2/I_4)$ | +2 | FALLING | $x_{24}$ |

FIG. 11

WAVELENGTH LOCKER AND OPTICAL SYSTEM USING THE SAME

FIELD OF THE INVENTION

This invention relates to photonic devices in general, and more particularly to tunable filters and tunable lasers.

BACKGROUND OF THE INVENTION

Tunable Fabry-Perot filters and tunable vertical cavity surface emitting lasers (VCSEL's) have recently generated considerable interest in the art. Among other things, these devices are believed to have application for a wide range of different optical components and systems, e.g., wavelength division multiplexing (WDM) fiberoptic systems, switches, routers, etc.

In some tunable Fabry-Perot filters and in some tunable VCSEL's, tuning is achieved by using an electrostatic field to move a top mirror relative to a bottom mirror, whereby to change the length of the Fabry-Perot cavity and hence tune the wavelength of the device.

While such a construction is advantageous in that it provides a fast and easy way to tune the device, in practice it has proven difficult to produce relatively uniform devices. Significant performance variations typically occur from device-to-device and from batch-to-batch. In addition, significant performance variations can also occur with a specific device over time, as the device ages, changes temperature, etc.

SUMMARY OF THE INVENTION

As a result, one object of the present invention is to provide a novel wavelength locker for use in tuning a tunable Fabry-Perot filter and/or a tunable VSCEL to a precise, known wavelength.

Another object of the present invention is to provide a novel method for tuning a tunable Fabry-Perot filter and/or a tunable VSCEL to a precise, known wavelength.

Still another object of the present invention is to provide a novel optical system incorporating the aforementioned wavelength locker.

These and other objects are addressed by the present invention. In one form of the invention, there is provided apparatus for use in tuning a tunable optical device to a target wavelength, the apparatus comprising a beam splitter for tapping a portion of the light emerging from the tunable optical device; a walk-off reflector for dividing the portion of light from the beam splitter into a plurality of beams; a multiple etalon for tailoring the light from at least two of the plurality of beams provided by the walk-off reflector; a multiple detector for detecting light from the multiple etalon and the walk-off reflector, the multiple detector providing a plurality of output signals; and a control unit for controlling the tunable optical device by providing a control signal to the tunable optical device according to the output signals provided by the multiple detector.

BRIEF DESCRIPTION OF THE DRAWINGS

These and other objects and features of the present invention will be more fully disclosed by the following detailed description of the preferred embodiments of the invention, which is to be considered together with the accompanying drawings wherein like numbers refer to like parts and further wherein.

DETAILED DESCRIPTION OF THE PREFERRED EMBODIMENTS

In pending prior U.S. patent application Ser. No. 09/105,399, filed Jun. 26, 1998 by Parviz Tayebati et al. for MICROELECTROMECHANICALLY TUNABLE, CONFOCAL, VERTICAL CAVITY SURFACE EMITTING LASER AND FABRY-PEROT FILTER (Attorney's Docket No. CORE-33), and in pending prior U.S. patent application Ser. No. 09/543,318, filed Apr. 5, 2000 by Peidong Wang et al. for SINGLE MODE OPERATION OF MICROELECTROMECHANICALLY TUNABLE, HALF-SYMMETRIC, VERTICAL CAVITY SURFACE EMITTING LASERS (Attorney's Docket No. CORE-53), and in pending prior U.S. patent application Ser. No. 09/750,434, filed Dec. 28, 2000 by Peidong Wang et al. for TUNABLE FABRY-PEROT FILTER AND TUNABLE VERTICAL CAVITY SURFACE EMITTING LASER (Attorney's Docket No. CORE-67), there are disclosed tunable Fabry-Perot filters and tunable vertical cavity surface emitting lasers (VCSEL's). The three aforementioned patent applications are hereby incorporated herein by reference.

Figure 1:
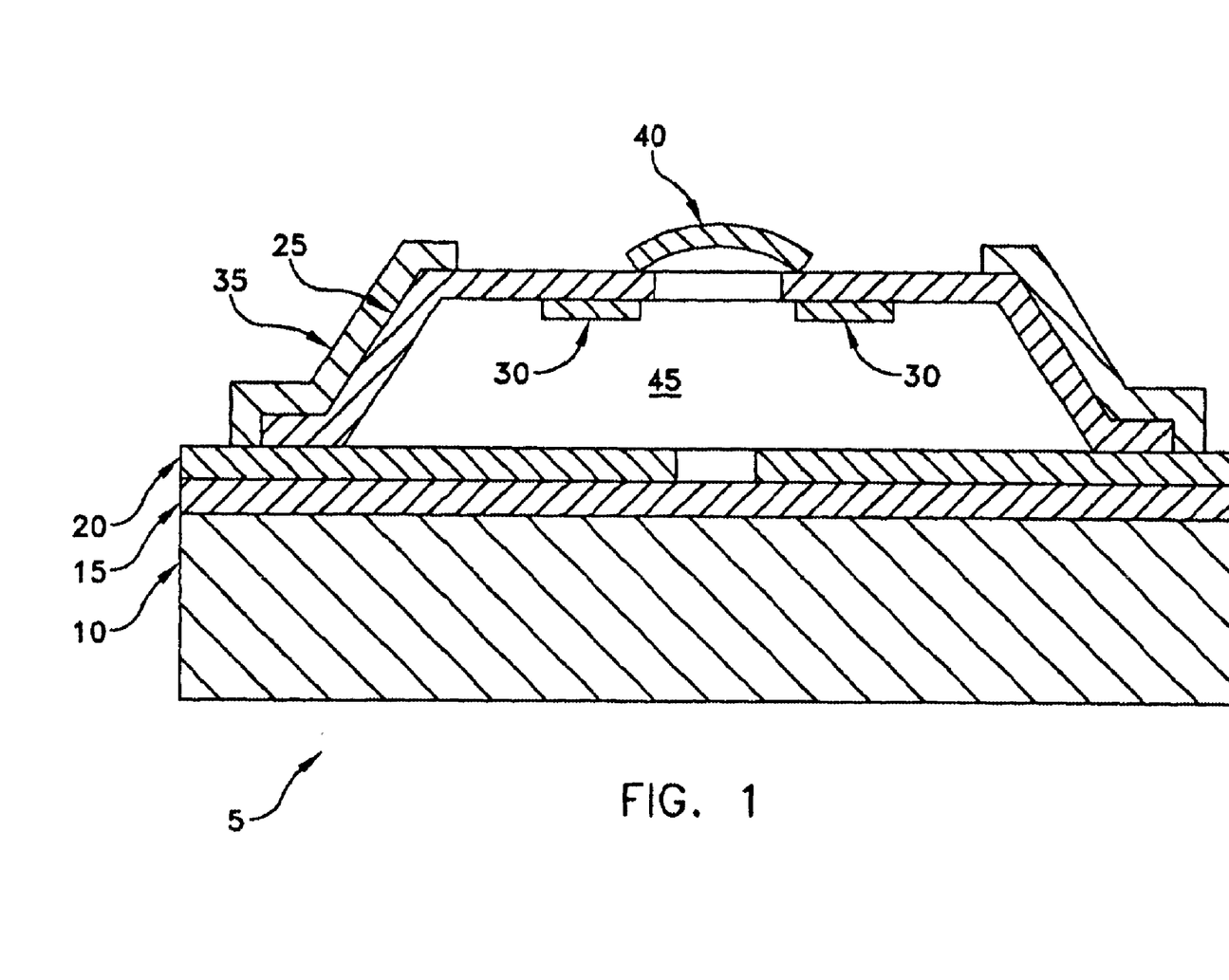
FIG. 1 is a schematic side sectional view of a tunable Fabry-Perot filter.

Looking now at FIG. 1, there is shown a tunable Fabry-Perot filter 5. Filter 5 generally comprises a substrate 10, a bottom mirror 15 mounted to the top of substrate 10, a bottom electrode 20 mounted to the top of bottom mirror 15, a thin membrane support 25 atop bottom electrode 20, a top electrode 30 fixed to the underside of thin membrane support 25, a reinforcer 35 fixed to the outside perimeter of thin membrane support 25, and a confocal top mirror 40 set atop thin membrane support 25, with an air cavity 45 being formed between bottom mirror 15 and top mirror 40.

As a result of this construction, a Fabry-Perot filter is effectively created between top mirror 40 and bottom mirror 15. Furthermore, by applying an appropriate voltage across top electrode 30 and bottom electrode 20, the position of top mirror 40 can be changed relative to bottom mirror 15, whereby to change the length of the Fabry-Perot cavity, and hence tune Fabry-Perot filter 5.

Figure 2:
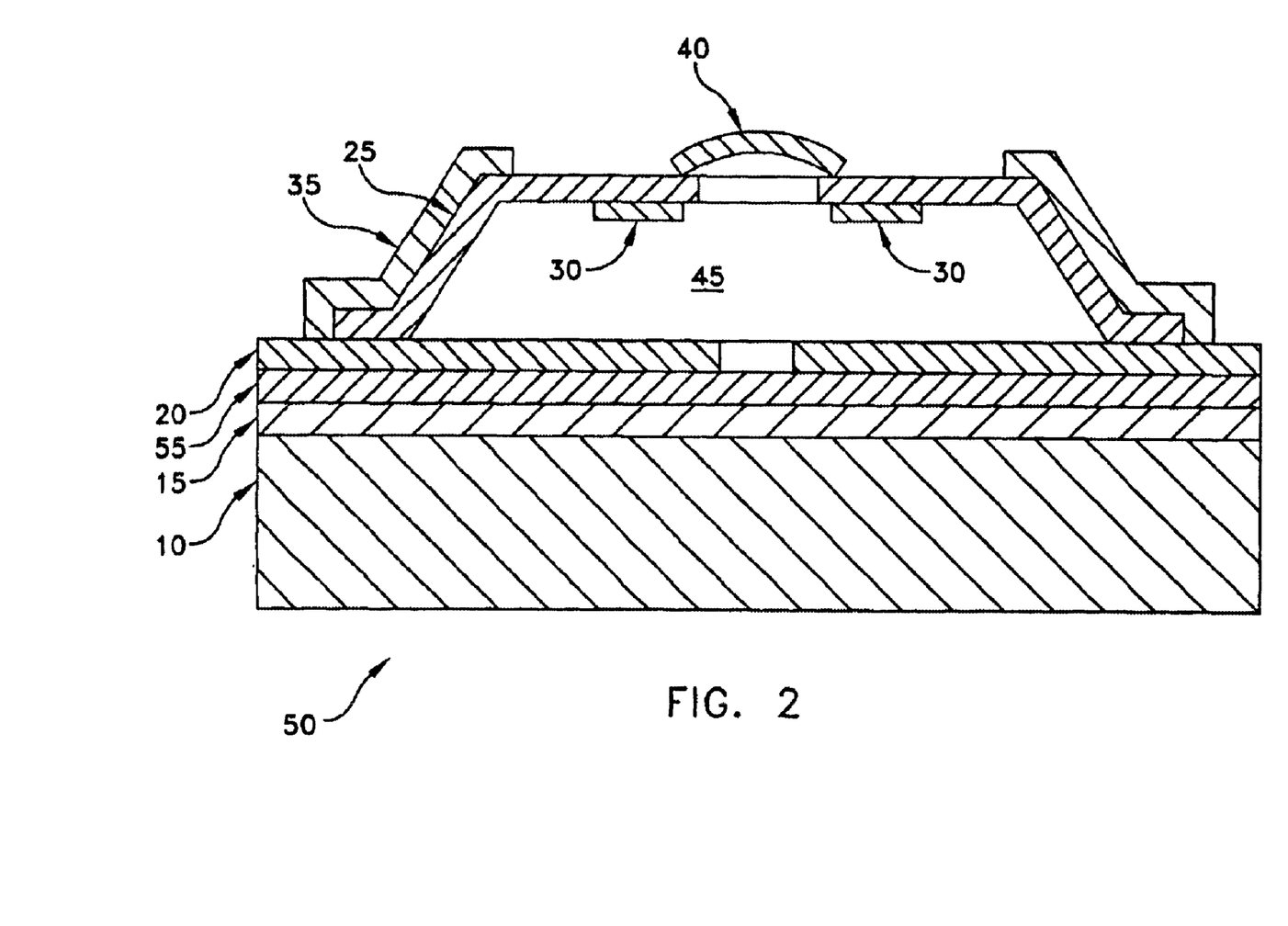
FIG. 2 is a schematic side sectional view of a tunable VCSEL.

Correspondingly, and looking next at FIG. 2, a tunable vertical cavity surface emitting laser (VCSEL) 50 can be constructed by positioning a gain region (or "active region") 55 between bottom mirror 15 and bottom electrode 20. As a result, when gain region 55 is appropriately stimulated, e.g., by optical pumping, lasing can be established between top mirror 40 and bottom mirror 15. Furthermore, by applying an appropriate voltage across top electrode 30 and bottom electrode 20, the position of top mirror 40 can be changed relative to bottom mirror 15, whereby to change the length of the laser's resonant cavity, and hence tune VCSEL 50.

As noted above, tunable Fabry-Perot filters and tunable VCSEL's of the type disclosed above are advantageous, since they can be quickly and easily tuned to a desired wavelength by simply changing the voltage applied across the top electrode and the bottom electrode.

However, it has also been found that tunable Fabry-Perot filters and tunable VCSEL's of the type disclosed above have performance characteristics which can vary slightly from unit to unit. In addition, it has also been found that the performance characteristics of any given unit can vary slightly in accordance with its age, temperature, etc. Accordingly, it is generally not possible to precisely predict in advance the exact voltage which must be applied to a particular device in order to tune that device to a specific wavelength. This can present an issue in some applications, particularly telecommunications applications, where the devices may need to be tuned to precise, known wavelengths (e.g., to the ITU WDM grid).

Figures 3, 3A:
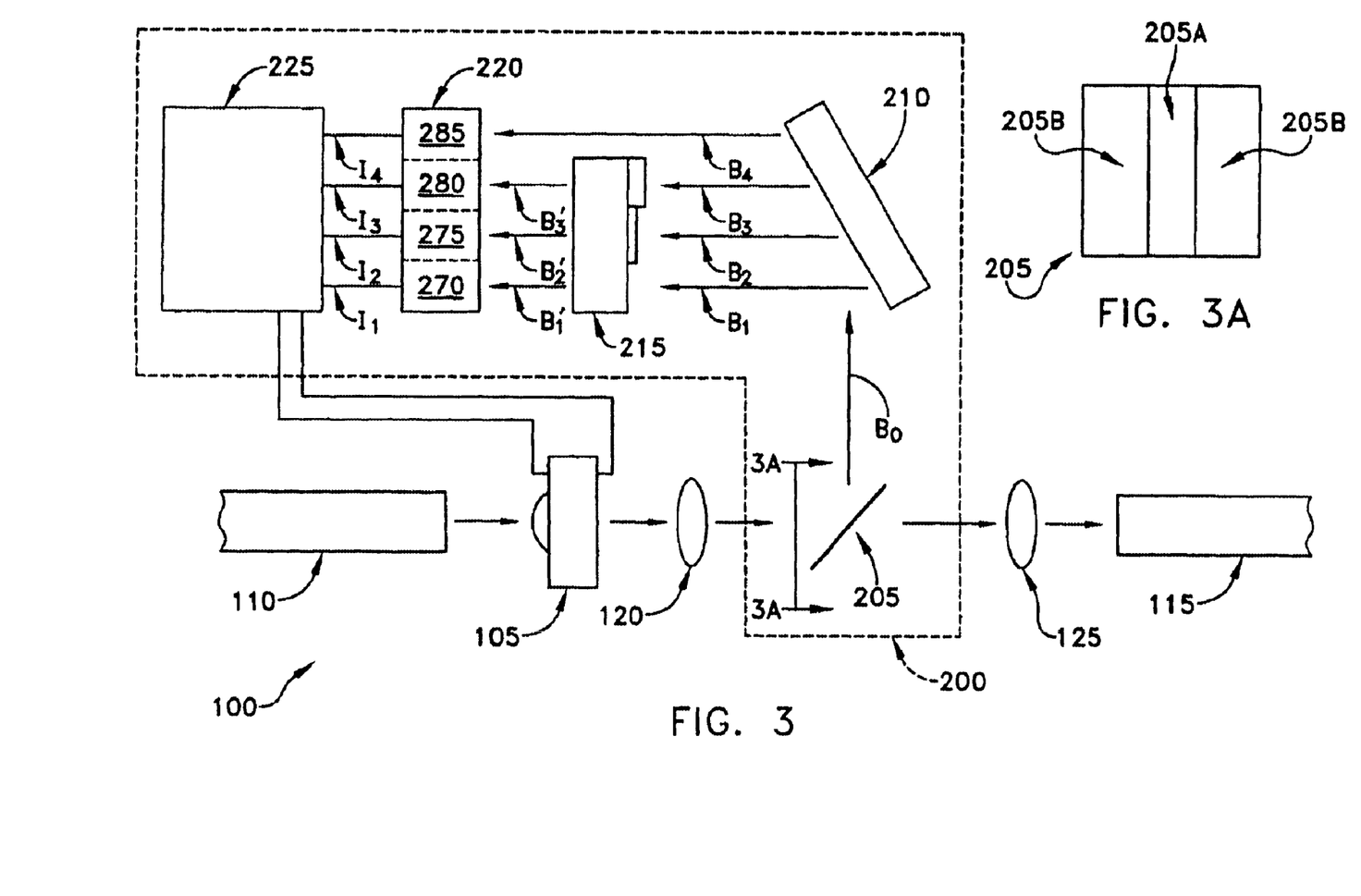
FIG. 3 is a schematic diagram of a novel optical system comprising a tunable Fabry-Perot filter or a tunable VCSEL, and further comprising a novel wavelength locker for use in tuning the tunable Fabry-Perot filter or tunable VCSEL to a precise, known wavelength.
FIG. 3A is a schematic view taken along line 3A—3A of FIG. 3.

Looking next at FIG. 3, there is shown a novel optical system 100 which comprises a tunable Fabry-Perot filter or tunable VCSEL 105, and which further comprises a novel wavelength tracker 200 for use in tuning the tunable Fabry-Perot filter or tunable VCSEL 105 to a precise, known wavelength.

More particularly, novel optical system 100 generally comprises the tunable Fabry-Perot filter or tunable VCSEL 105, a pair of optical fibers 110 and 115, and a pair of collimating lenses 120 and 125. Where tunable device 105 comprises a tunable Fabry-Perot filter, optical fiber 110 might comprise an input line and optical fiber 115 might comprise an output line, with the tunable Fabry-Perot filter serving to ensure that only light of a selected wavelength passes from the input line to the output line. Where tunable device 105 comprises a tunable VSCEL, optical fiber 110 might comprise an input line to deliver pump light from an optical pump laser to the VCSEL, and optical fiber 115 might comprise an output line for carrying off the laser light generated by the VCSEL.

The tunable device is preferably a tunable Fabry-Perot filter or tunable VCSEL of the type disclosed above. It should also be appreciated, however, that the tunable Fabry-Perot filter or tunable VCSEL 105 may also comprise other known types of tunable filters and tunable VCSEL's compatible with the present invention.

Novel optical system 100 also comprises the novel wavelength locker 200 for use in tuning the tunable Fabry-Perot filter or tunable VCSEL 105 to a precise, known wavelength. Wavelength locker 200 generally comprises a beam splitter 205 for tapping a small amount of the light emerging from tunable device 105; a walk-off reflector 210 for dividing the light from beam splitter 205 into first, second, third and fourth beams; a multiple etalon 215 for tailoring the light from the first, second and third beams provided by walk-off reflector 210; a multiple detector 220 for detecting the light from the first, second and third beams as they emerge from multiple etalon 215 and the light from the fourth beam provided by walk-off reflector 205; and a control unit 225 for controlling the tuning voltages applied to tunable device 105 according to the outputs of multiple detector 220, whereby to tune tunable device 105 to a precise, known wavelength.

Beam splitter 205 comprises a beam splitter which is adapted to divert a small amount of the light emerging from tunable device 105 to walk-off reflector 210, while still passing the great majority of the light emerging from tunable device 105 on to optical fiber 115. By way of example but not limitation, beam splitter 205 might divert 2% of the light emerging from tunable device 105 to walk-off detector 210 while passing the remaining 98% of the light emerging from tunable device 105 on to optical fiber 115. Beam splitter 205 preferably has a conventional design of the sort well known in the art, except that it is intended to divert a rectangular column of light (i.e., a column of light having a rectangular cross-section) to walk-off reflector 210. To this end, it is preferred that beam splitter 205 have a working face, as seen in FIG. 3A, with a rectangularly-shaped reflective surface 205A and non-reflective surfaces 205B.

Figure 4:
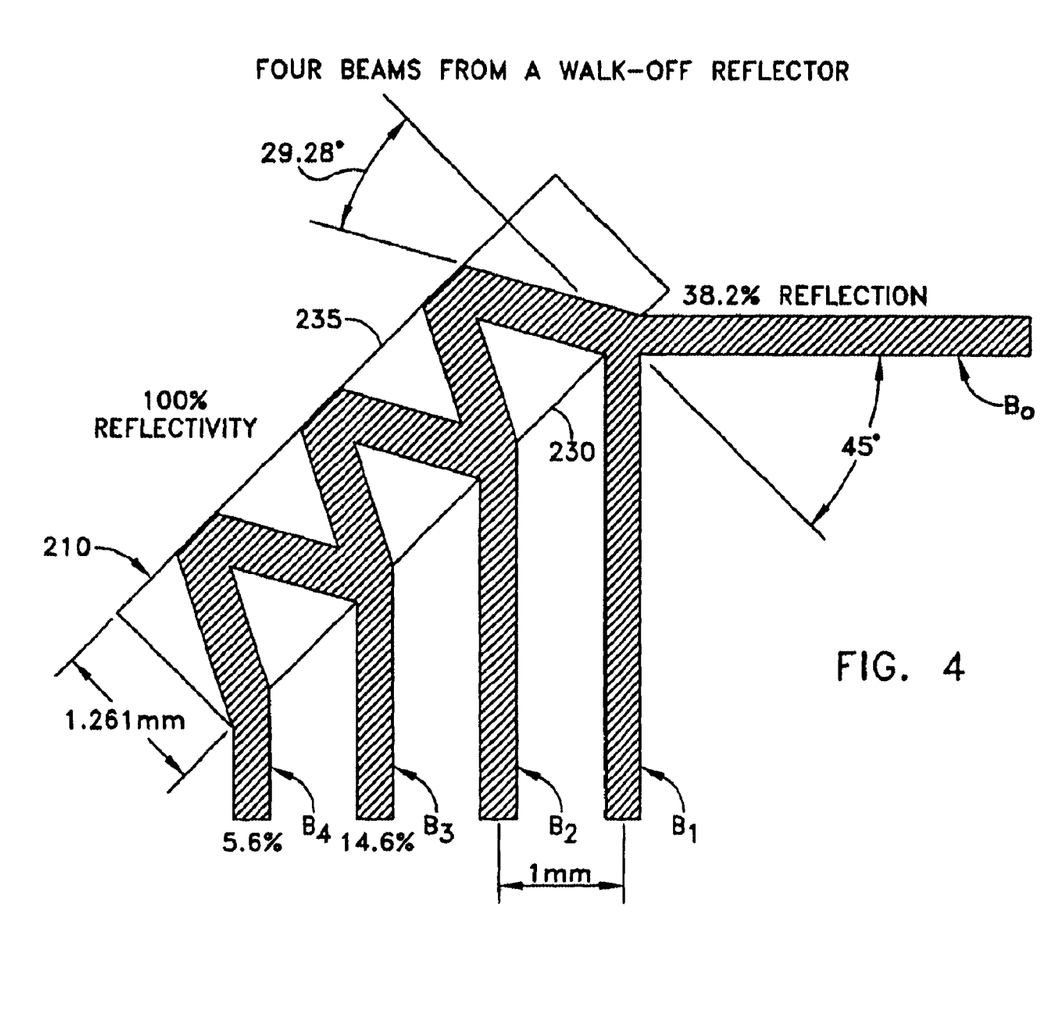
FIG. 4 is a schematic diagram of a walk-off reflector incorporated into the wavelength locker shown in FIG. 3.

Walk-off reflector 210 is shown in greater detail in FIG. 4. Walk-off reflector 210 effectively creates four parallel beams from the single beam received from beam splitter 205. More particularly, walk-off reflector 210 receives a beam of light $B_0$ from beam splitter 205 and creates a first beam $B_1$, a second beam $B_2$, a third beam $B_3$ and a fourth beam $B_4$. It should be appreciated that walk-off reflector 210 merely divides the beam $B_0$ into four separate beams $B_1$, $B_2$, $B_3$ and $B_4$; the walk-off reflector does not affect the wavelength of the light during this beam division. Thus, the wavelengths of beams $B_1$, $B_2$, $B_3$ and $B_4$ are identical to the wavelength of beam $B_0$.

Walk-off reflector 210 is preferably formed out of 1.261 mm thick fused silica (n=1.444), with the front side 230 being coated (r=38.2%), and the back side 235 being coated (r=100%), such that the beams walk off at a 1 mm spacing.

Figure 5:
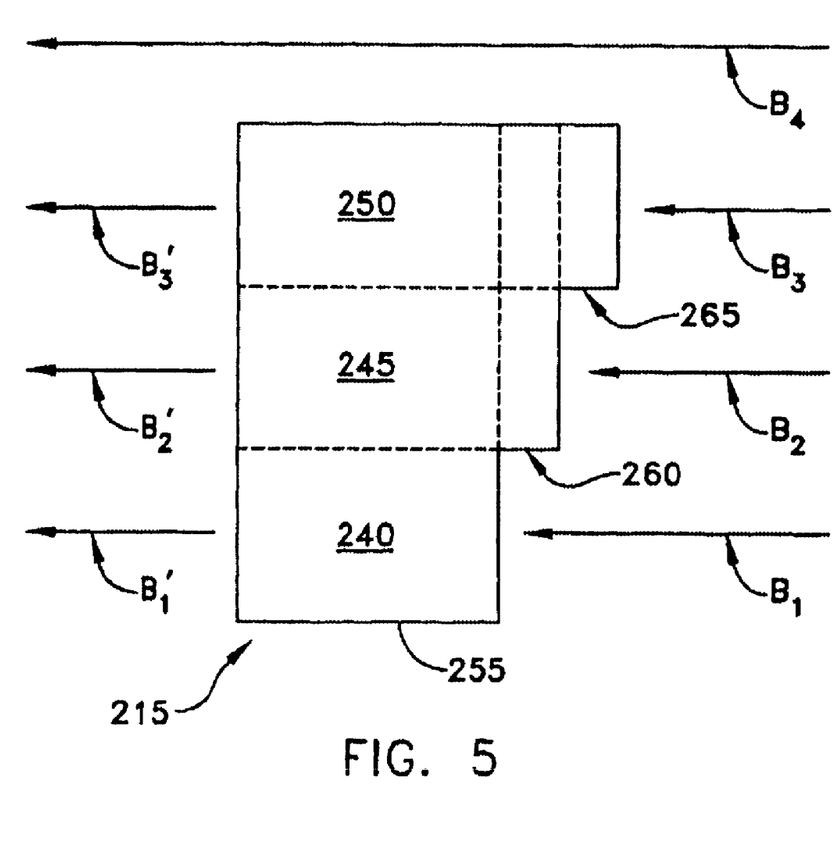
FIG. 5 is a schematic diagram of a multiple etalon incorporated into the wavelength locker shown in FIG. 3.

Multiple etalon 215 is shown in greater detail in FIG. 5. Multiple etalon 215 essentially comprises three separate Fabry-Perot etalons; a first etalon 240, a second etalon 245 and a third etalon 250. In general, and looking now at FIG. 6, Fabry-Perot etalons have a periodic transmission profile TP comprising a plurality of transmission peaks P spaced across a range of wavelengths. It will be appreciated that the exact locations (i.e., wavelengths) of these transmission peaks P are a function of the wavelength of the light entering the etalon, and a function of the etalon's substrate thickness and refractive index, neither of which varies significantly with time.

In accordance with the present invention, first etalon 240, second etalon 245 and third etalon 250 are fabricated so that there is a pre-determined relationship between their respective transmission profiles. More particularly, and looking now at FIG. 7, the beam $B_1'$ emerging from first etalon 240 will have a first transmission profile, the beam $B_2'$ emerging from second etalon 245 will have a second transmission profile which is phase shifted a quarter wavelength from the transmission profile of the beam $B_1'$ emerging from first etalon 240, and the beam $B_3'$ emerging from third etalon 250 will have a transmission profile which will consist of a single transmission peak within the wavelengths of interest.

Multiple etalon 215 may be formed in various ways known in the art. By way of example but not limitation, multiple etalon 215 may comprise a multilayered dielectric stack comprising a base layer 255, a second layer 260 deposited on base layer 255, and a third layer 265 deposited on second layer 260. In essence, base layer 255 forms first etalon 240; base layer 255 and second layer 260 together form second etalon 245; and base layer 255, second layer 260 and third layer 265 together form third etalon 250. In one preferred form of the invention, base layer 255, second layer 260 and third layer 265 are all formed out of $SiO_2$.

By placing walk-off reflector 210 and multiple etalon 215 in series, in the manner shown in FIG. 3, the beam $B_1$ leaving walk-off reflector 210 will be tailored by the transmission profile of first etalon 240 so as to create the beam $B_1'$; the beam $B_2$ leaving walk-off reflector 210 will be tailored by the transmission profile of second etalon 245 so as to create the beam $B_2'$; and the beam $B_3$ leaving walk-off reflector 210 will be tailored by the transmission profile of third etalon 250 so as to create the beam $B_3'$.

Multiple detector 220 comprises four separate detectors 270, 275, 280 and 285. Multiple detector 220 is positioned so that the beam $B_1'$ falls on detector 270, the beam $B_1'$ falls on detector 275, the beam $B_3'$ falls on detector 280, and the beam $B_4$ (which emerges directly from walk-off reflector 210 and does not pass through multiple etalon 220) falls on detector 285. The outputs $I_1$, $I_2$, $I_3$ and $I_4$ are passed from detectors 270, 275, 280 and 285, respectively, to control unit 225.

In this respect it will be appreciated that inasmuch as the outputs $I_1$, $I_2$ and $I_3$ correspond to the beams $B_1'$, $B_2'$ and $B_3'$ emerging from first etalon 240, second etalon 245 and third etalon 250, respectively, and falling on detectors 270, 275 and 280, respectively, outputs $I_1$, $I_2$ and $I_3$ will have an output profile similar to the output profiles of the beams $B_1'$, $B_2'$ and $B_3'$, respectively. Compare, for example, the output profiles of the outputs $I_1$, $I_2$ and $I_3$ in FIG. 8 to the output profiles of the beams $B_1'$, $B_2'$ and $B_3'$ in FIG. 7.

Figure 8:
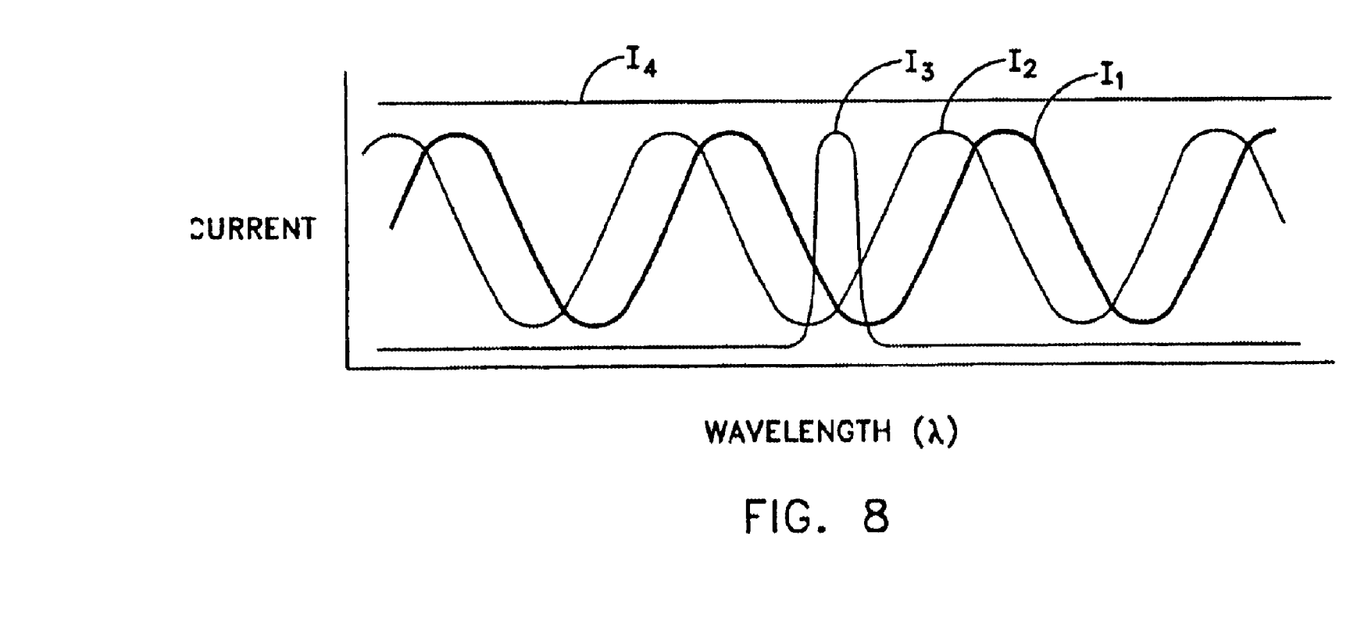
FIG. 8 is a schematic diagram of the output profiles of a multiple detector incorporated into the wavelength locker shown in FIG. 3.

On the other hand, it will also be appreciated that inasmuch as the output $I_4$ corresponds to the beam $B_4$ emerging directly from walk-off reflector 210 and falling directly on detector 285, without passing through multiple etalon 215, the output $I_4$ will have a substantially flat profile, such as that shown in FIG. 8.

Figure 6:
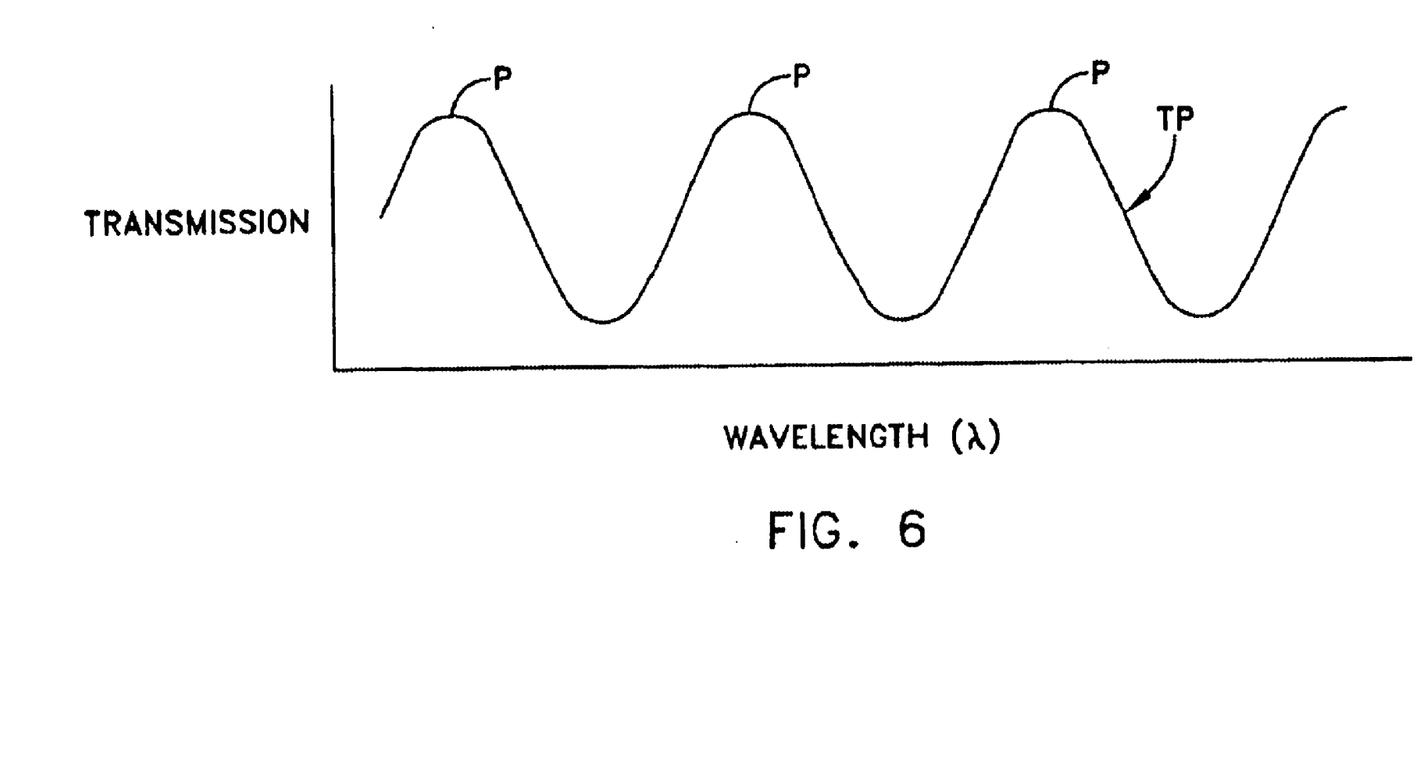
FIG. 6 is a schematic diagram of the transmission profile of a typical etalon.
Figure 7:
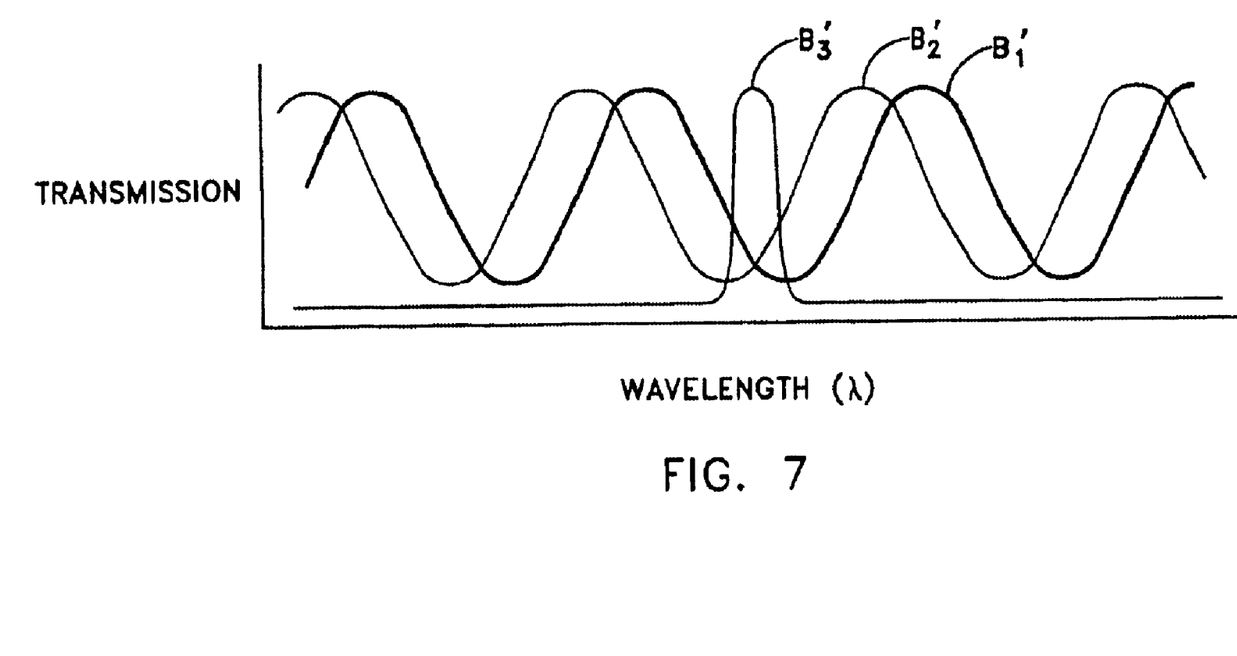
FIG. 7 is a schematic diagram of the transmission profiles of the multiple etalon shown in FIG. 3.
Figure 9:
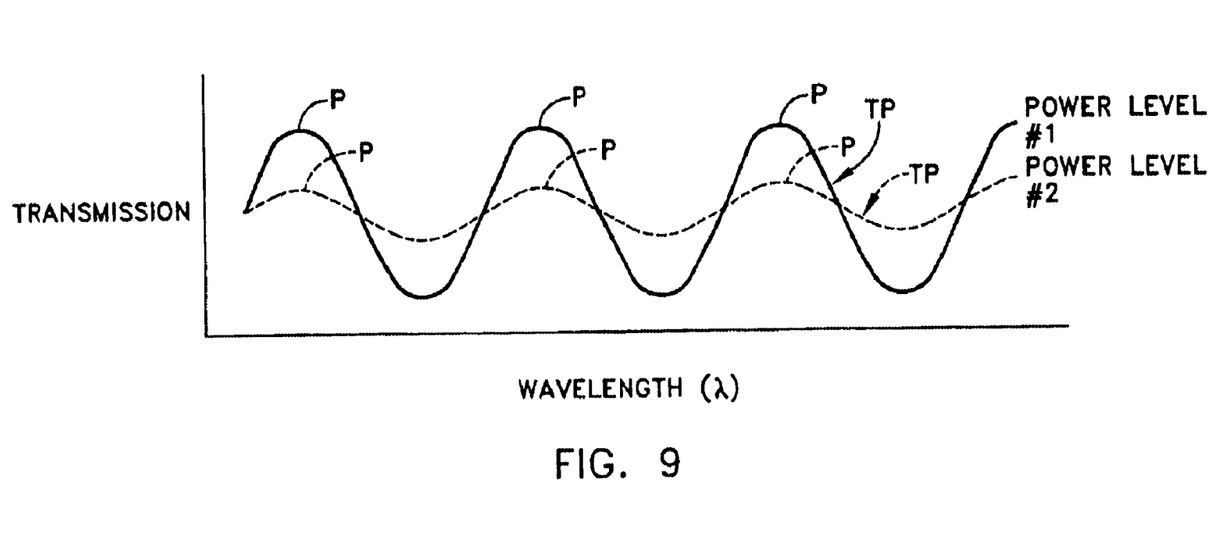
FIG. 9 is a schematic diagram of the transmission profiles of a typical etalon at two different power levels.

It should also be appreciated that the transmission profiles shown in FIGS. 6 and 7, and the current profiles shown in FIG. 8, will vary according to power. Thus, for example, and looking now at FIG. 9, there are shown the transmission profiles for a given etalon at two different power levels.

Figure 10:
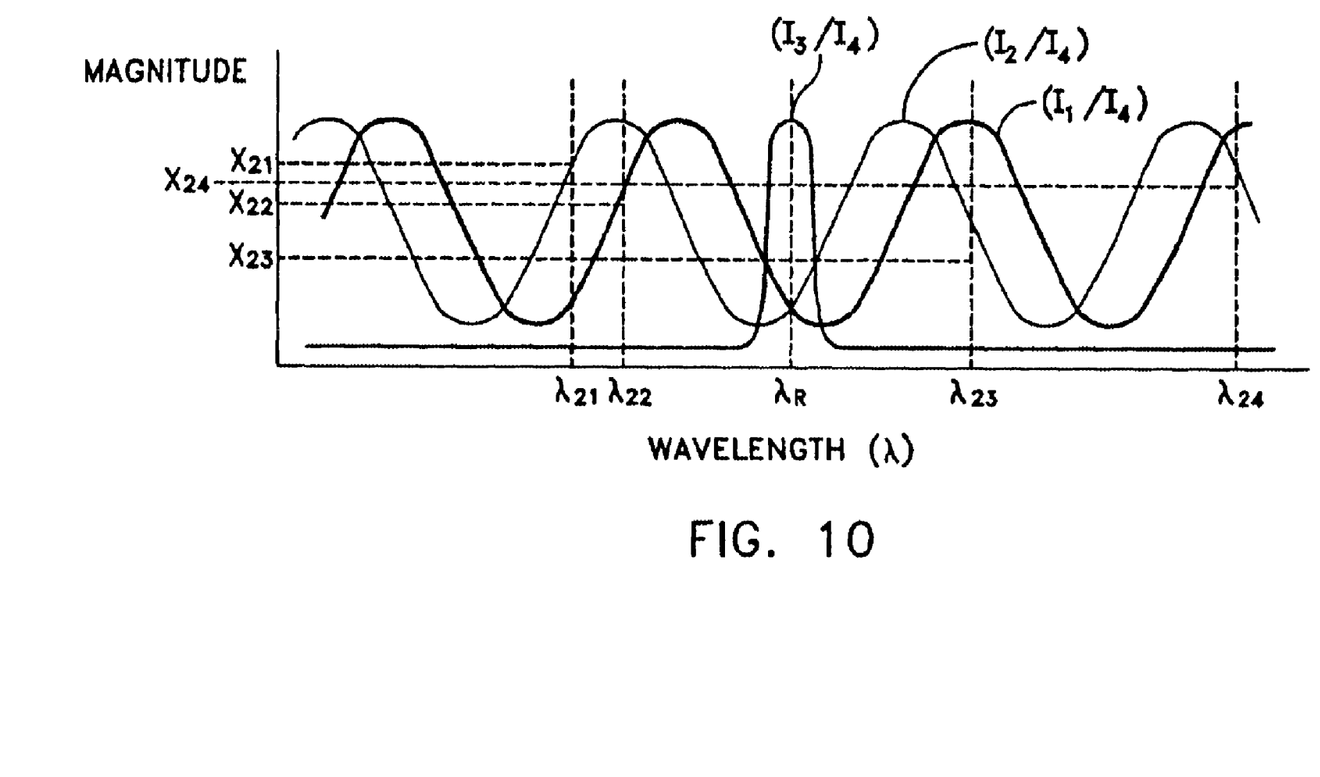
FIG. 10 is a schematic diagram of the regularized, power independent output profiles of the multiple detector incorporated into the wavelength locker shown in FIG. 3.

However, the fact that output $I_4$ is substantially flat permits the current profiles shown in FIG. 8 to be regularized, i.e., to be rendered power independent, by determining the values $(I_1/I_4)$, $(I_2/I_4)$ and $(I_3/I_4)$. Thus, and looking now at FIG. 10, there is shown the regularized, power-independent current profiles $(I_1/I_4)$, $(I_2/I_4)$ and $(I_3/I_4)$ which correspond to the beams $B_1'B_2'$ and $B_3'$, respectively, emerging from first etalon 240, second etalon 245 and third etalon 250, respectively.

During initial calibration, control unit 225 receives the outputs $I_1$, $I_2$, $I_3$ and $I_4$ from the detectors 270, 275, 280 and 285, respectively, and uses those outputs to build a lookup table whereby the control unit 225 nay thereafter, during operation in the field, tune tunable device 105 to the desired wavelength.

More particularly, during calibration, tunable device 105 is swept through its tuning range so as to successively output light across a range of wavelengths. Where tunable device 105 is a tunable filter, this can be done by passing a broadband light source into the tunable filter while the tunable filter is swept across its tuning range; alternatively, where tunable device 105 is a tunable VCSEL, this can be done by sweeping the VCSEL across its tuning range while lasing. In either case, as light is emitted from tunable device 105 across a range of wavelengths, this light is simultaneously passed (i) to a wavelength monitor located downstream of optical fiber 115, and (ii) into wavelength locker 200. Control unit 225 builds a lookup table such that the control unit 225 may thereafter tune tunable device 105 to the desired wavelength.

In particular, as the tunable device is swept through its tuning range, the normalized output $(I_3/I_4)$ is monitored until its peak is encountered; at this point the device has been tuned to a known wavelength $\lambda_R$. Then, for each wavelength (i.e., optical channel) of interest, its location can be identified along a specific normalized output profile $(I_1/I_4)$ or $(I_2/I_4)$ by (i) counting the number of peaks encountered "up" or "down" from $\lambda_R$, (ii) identifying whether the slope of that normalized output profile is positive or negative at that point, and (iii) identifying the specific magnitude of the normalized output $(I_1/I_4)$ or $(I_2/I_4)$. This information can be recorded in a lookup table (FIG. 1) stored in control unit 225.

In theory, it is possible to use just one of the normalized output profiles $(I_1/I_4)$ or $(I_2/I_4)$, in addition to the normalized output profile $(I_3/I_4)$, to identify a specific wavelength. However, in practice, it has been found that the normalized output profiles $(I_1/I_4)$ and $(I_2/I_4)$ tend to have a relative shallow slope about their peaks: as a result, a relatively substantial change in wavelength may only result in a very modest change in normalized output. This can be difficult to detect and/or require the use of more sensitive, and hence more expensive, components.

To address this, it is preferred that at least two normalized output profiles $(I_1/I_4)$ and $(I_2/I_4)$ be provided, where the two normalized output profiles are offset from one another by a quarter wavelength. With such a construction, one of the normalized output profiles will always have a significant-slope whenever the other of the normalized output profiles has a nominal slope, and vice versa.

During field operation, when it is desired to tune turnable device 105 to a particular wavelength, the device is swept through its tuning range as the normalized output $(I_3/I_4)$ is monitored. When the peak for the normalized output $(I_3/I_4)$ is located, the tuning voltage is adjusted according to the lookup table shown in FIG. 11 until the desired wavelength is obtained.

Figure 11:
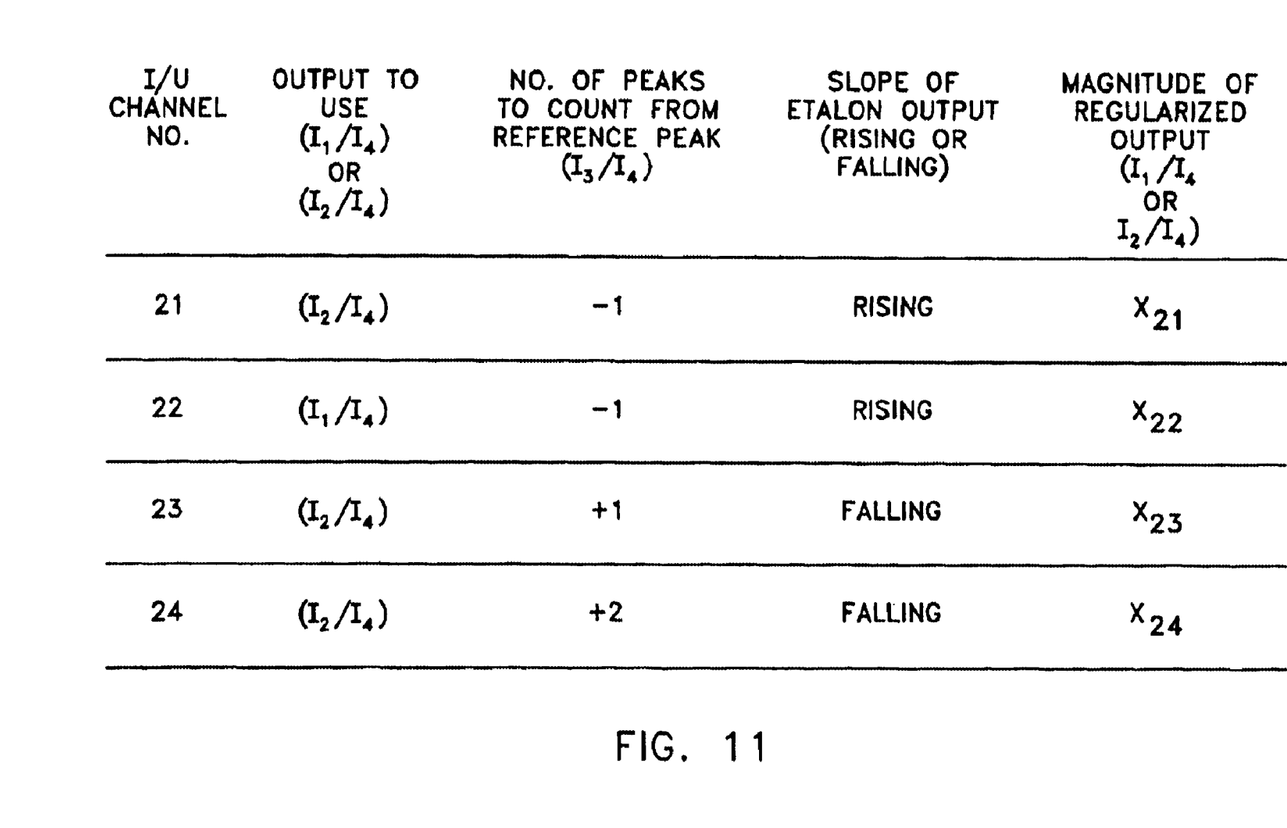
FIG. 11 is a lookup table illustrating how the regularized, power independent output profiles shown in FIG. 10 may be used to tune a turnable device to a target wavelength.

By way of example, suppose it is desired to tune tunable device 105 to optical channel "24". First tunable device 105 is swept through its tuning range until the peak for the normalized output $(I_3/I_4)$ is encountered. Then, while monitoring the normalized output $(I_2/I_4)$, as indicated in the lookup table for channel 24, the tuning voltage is adjusted so as to (i) count up two peaks, (ii) bring the slope of the normalized output $(I_3/I_4)$ negative (or falling) and then (iii) bring the normalized output $(I_2/I_4)$ to a magnitude of $X_{24}$. At this point tunable device 105 will be accurately turned to the wavelength $\lambda_{24}$, i.e., channel 24.

Correspondingly, suppose it is thereafter desired to tune tunable device 105 to optical channel "22". First tunable device 105 is swept through its tuning range until the peak for the normalized output $(I_3/I_4)$ is encountered. Then, while monitoring the normalized output $(I_1/I_4)$ as indicated in the lookup table for channel 22, the tuning voltage is adjusted so as to (i) count down one peak, (ii) bring the slope of the normalized output ($I_1/I_4$) positive (or rising), and then (iii) bring the normalized output ($I_1/I_4$) to a magnitude $X_{22}$. At this point tunable device 105 will be tuned to the wavelength $\lambda_{22}$, i.e., channel 22.

It will be appreciated that in the foregoing construction, beam splitter 205 and walk-off reflector 210 essentially serve, collectively, as a splitter unit to tap a portion of the light emerging from tunable device 105 and create a plurality of beams which may then be fed into multiple etalon 215 and multiple detector 220. However, it should also be appreciated that alternative constructions may also be provided. Thus, for example, the beam splitter may be configured to generate a single round column of light, and the multiple etalon 215 and multiple detector 220 will have appropriate configurations so as to permit them to appropriately tailor and detect portions (e.g., quadrants) of that column of light. Alternatively, the beam splitter may be configured to generate, and multiple etalon 215 and multiple detector 220 may be configured to use, a beam of light having other cross-sectional shapes, e.g., elliptical, square or rectangular, other polygonal shapes, donut shapes, etc.

It is to be understood that the present invention is by no means limited to the particular constructions and method steps disclosed above and/or shown in the drawings, but also comprises any modifications or equivalents within the scope of the claims.

What is claimed is:

1. Apparatus for use in tuning a tunable optical device to a target wavelength, said apparatus comprising:
   a beam splitter for tapping a portion of the light emerging from the tunable optical device;
   a walk-off reflector for dividing said portion of the light emerging from said beam splitter into a plurality of beams;
   a multiple etalon for tailoring the light from at least two of said plurality of beams provided by said walk-off reflector;
   a multiple detector for detecting light from said multiple etalon and said walk-off reflector, said multiple detector providing a plurality of output signals; and
   a control unit for controlling the tunable optical device by providing a control signal to the tunable optical device according to said output signals provided by said multiple detector.

2. Apparatus according to claim 1 wherein said walk-off reflector divides said portion of the light emerging from said beam splitter into a first beam, a second beam, a third beam and a fourth beam.

3. Apparatus according to claim 2 wherein said multiple etalon tailors said first beam, said second beam and said third beam provided by said walk-off reflector.

4. Apparatus according to claim 3 wherein said multiple detector (i) detects the tailored light from said first beam as said beam emerges from said multiple etalon and generates a first output signal; (ii) detects the tailored light from said second beam as said beam emerges from said multiple etalon and generates a second output signal; (iii) detects the tailored light from said third beam as said beam emerges from said multiple etalon and generates a third output signal; and (iv) detects the light from said fourth beam as said beam emerges from said walk-off reflector and generates a fourth output signal.

5. Apparatus according to claim 1 wherein said first, second, third and fourth output signals provided by said multiple detector are in the form of electrical currents.

6. Apparatus according to claim 1 wherein said control signal provided by said control unit is in the form of a voltage.

7. Apparatus according to claim 1 wherein each of said plurality of beams provided by said walk-off reflector has a wavelength identical to the wavelength of said portion of light emerging from said beam splitter.

8. Apparatus according to claim 1 wherein said walk-off reflector is formed out of fused silica.

9. Apparatus according to claim 8 wherein said fused silica walk-off reflector has a front side and a back side in opposition to one another, and further wherein said back side has a coating.

10. Apparatus according to claim 8 wherein said front side of said fused silicon walk-off reflector has a coating.

11. Apparatus according to claim 9 wherein said back side coating has a reflectivity of 100%.

12. Apparatus according to claim 10 wherein said front side coating has a reflectivity of 38.2%.

13. Apparatus according to claim 12 wherein said back side coating has a reflectivity of 100%.

14. Apparatus according to claim 13 wherein said fused silica walk-off reflector has a thickness of 1.261 mm.

15. Apparatus according to claim 14 wherein said plurality of teams are separated by a 1 mm spacing.

16. Apparatus according to claim 1 wherein said multiple etalon comprises at least one separate etalon.

17. Apparatus according to claim 16 wherein said multiple etalon comprises a first etalon, a second etalon and a third etalon.

18. Apparatus according to said claim 2 wherein said multiple etalon comprises a first etalon, a second etalon and a third etalon.

19. Apparatus according to claim 18 wherein said first etalon, said second etalon and said third etalon each have a transmission profile, and further wherein these transmission profiles have a pre-determined relationship one another.

20. Apparatus according to claim 19 wherein said first and second etalons have transmission profiles which are set a quarter wavelength apart.

21. Apparatus according to claim 18 wherein said third etalon is formed so as to have a single transmission peak within the wavelengths of interest.

22. Apparatus according to claim 1 wherein the optical device is a tunable Fabry-Perot filter.

23. Apparatus according to claim 1 wherein the optical device is a tunable VCSEL.

24. An optical system comprising:
   a tunable optical device; and
   apparatus for use in tuning said tunable optical device to a target wavelength, said apparatus comprising:
      a beam splitter for tapping a portion of the light emerging from said tunable optical device;
      a walk-off reflector for dividing said portion of the light emerging from said beam splitter into a plurality of beams;
      a multiple etalon for tailoring the light from at least two of said plurality of beams provided by said walk-off reflector;
      a multiple detector for detecting light from said multiple etalon and said walk-off reflector, said multiple detector providing a plurality of output signals; and
      a control unit for controlling said tunable optical device by providing a control signal to said tunable optical device according to said output signals provided by said multiple detector.

25. Apparatus according to claim 1 wherein said beam splitter comprises a reflective surface having a substantially rectangular configuration.

* * * * *